(12) United States Patent
Li et al.

(10) Patent No.: US 11,778,296 B2
(45) Date of Patent: Oct. 3, 2023

(54) CAMERA MODULE AND ELECTRONIC DEVICE HAVING THE CAMERA MODULE

(71) Applicant: TRIPLE WIN TECHNOLOGY (SHENZHEN) CO. LTD., Shenzhen (CN)

(72) Inventors: Jing-Wei Li, Guangdong (CN); Ding-Nan Huang, New Taipei (TW); Jian-Chao Song, Guangdong (CN); Yu-Shuai Li, Shenzhen (CN)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 17/508,262

(22) Filed: Oct. 22, 2021

(65) Prior Publication Data

US 2022/0191364 A1    Jun. 16, 2022

(30) Foreign Application Priority Data

Dec. 14, 2020 (CN) .......................... 202011476059.X

(51) Int. Cl.
  *H04N 23/55* (2023.01)
  *H05K 1/18* (2006.01)
  *H04N 23/52* (2023.01)

(52) U.S. Cl.
  CPC ............. *H04N 23/55* (2023.01); *H04N 23/52* (2023.01); *H05K 1/181* (2013.01); *H05K 1/183* (2013.01); *H05K 2201/10151* (2013.01)

(58) Field of Classification Search
  CPC ............. H04N 5/2254; H04N 5/22521; H04N 5/2257; H04N 5/2251; H05K 1/181; H05K 1/183; H05K 2201/10151; H04M 1/0264
  See application file for complete search history.

(56) References Cited

U.S. PATENT DOCUMENTS

| | | | |
|---|---|---|---|
| 2006/0178479 A1* | 8/2006 | Hashimoto | C09D 151/003 525/191 |
| 2008/0224248 A1* | 9/2008 | Yang | H04N 5/2257 257/E31.117 |
| 2009/0160998 A1* | 6/2009 | Fukamachi | H04N 5/2257 156/60 |
| 2013/0271649 A1* | 10/2013 | Halliday | H04N 5/2254 348/374 |

(Continued)

FOREIGN PATENT DOCUMENTS

| | | |
|---|---|---|
| TW | 202001352 A | 1/2020 |
| WO | 2017/143966 A1 | 8/2017 |

*Primary Examiner* — Jason A Flohre
(74) *Attorney, Agent, or Firm* — ScienBiziP, P.C.

(57) ABSTRACT

A camera module includes a circuit board, a photosensitive chip, a filter, a 1 holder, and a lens assembly. A receiving groove is recessed from a surface of the circuit board. The photosensitive chip is received in the receiving groove. The holder is mounted on the surface of the circuit board and covers the photosensitive chip. The filter is mounted in the holder and spaced from the photosensitive chip. The lens assembly is mounted on the holder and located at a side of the filter facing away from the photosensitive chip. A dustproof layer is laid on the surface of the circuit board facing the filter and surrounds the photosensitive chip. An electronic device having the camera module is also provided.

6 Claims, 5 Drawing Sheets

(56) References Cited

U.S. PATENT DOCUMENTS

| | | | |
|---|---|---|---|
| 2014/0192464 A1* | 7/2014 | Astle | B05D 1/322 |
| | | | 361/679.01 |
| 2017/0367193 A1* | 12/2017 | Lee | C09D 7/67 |
| 2019/0361193 A1* | 11/2019 | Zhang | G02B 27/0955 |
| 2019/0387142 A1 | 12/2019 | Zhang et al. | |
| 2020/0374426 A1* | 11/2020 | Gu | H04N 5/2254 |
| 2021/0112662 A1* | 4/2021 | Seo | H05K 1/181 |
| 2022/0171183 A1* | 6/2022 | Hsu | G02B 27/0006 |

* cited by examiner

CAMERA MODULE AND ELECTRONIC DEVICE HAVING THE CAMERA MODULE

FIELD

The subject matter herein generally relates to a camera module and an electronic device having the camera module.

BACKGROUND

Most camera modules include a lens, a lens holder, a filter, a photosensitive chip, and a circuit board. The lens is installed in the lens holder, the lens holder and the photosensitive chip are installed on the circuit board, and the filter is installed above the photosensitive chip. When the lens is installed in the lens holder, dust and impurities can be easily gathered. When dust and impurities fall on the filter, the image becomes stained, and the dust and impurities will also rise and fall when the camera module is shaken or dropped.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

Figure 1:
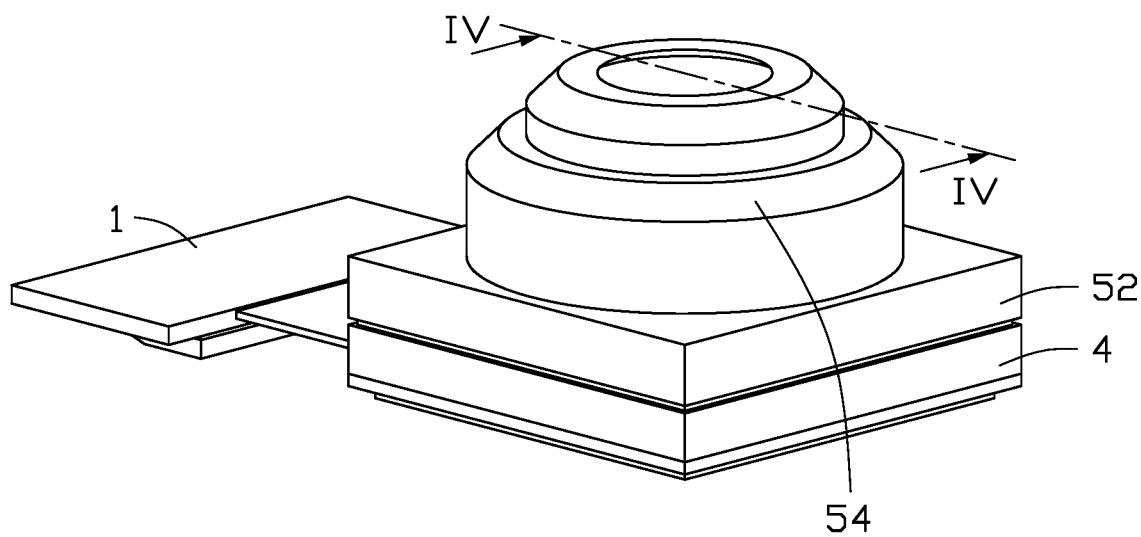
FIG. 1 is a diagram of an embodiment of a camera module according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
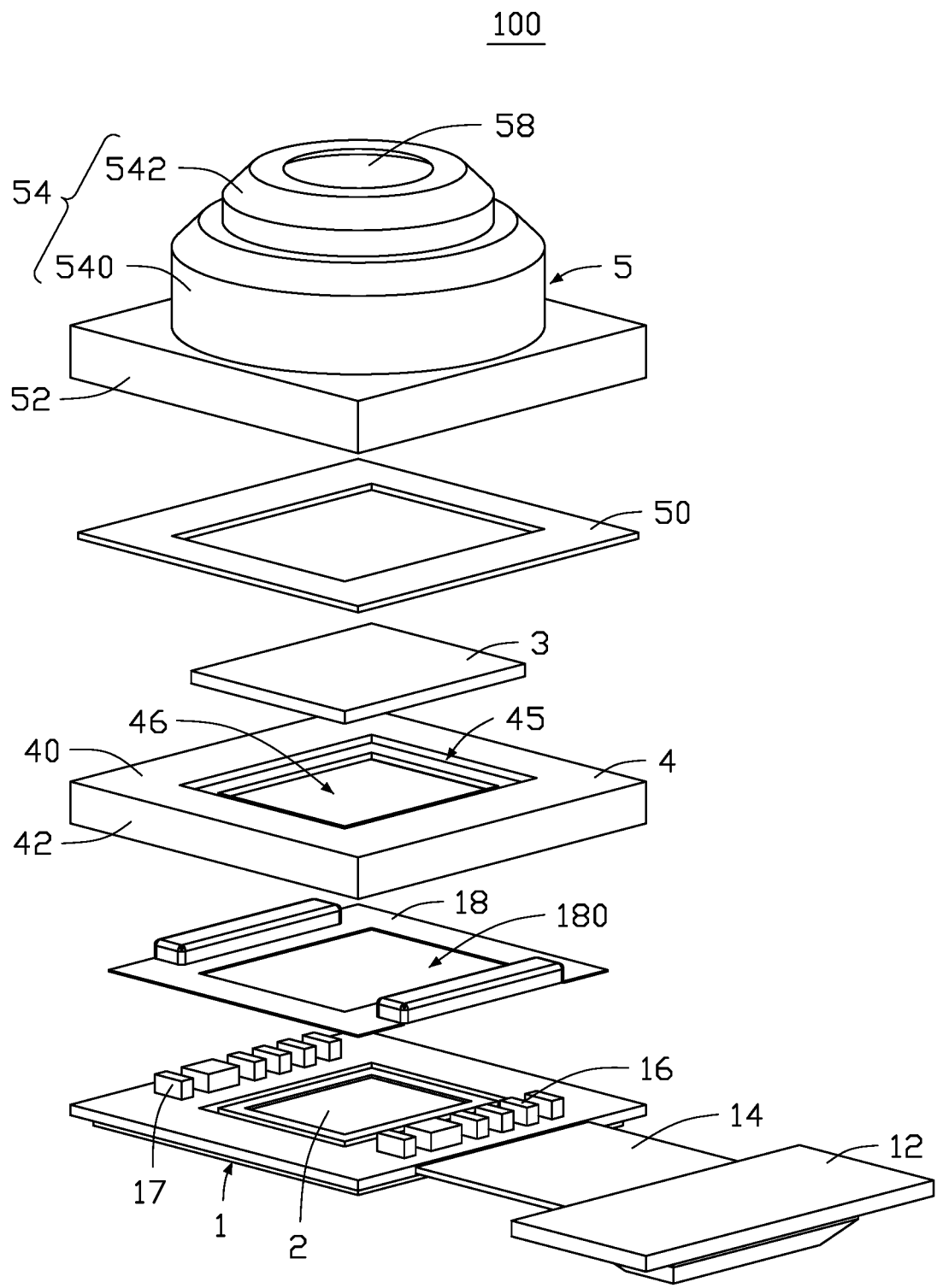
FIG. 2 is an exploded, diagrammatic view of an embodiment of a camera module according to the present disclosure.

FIG. 1 illustrates an embodiment of a camera module 100. Referring to FIGS. 1 and 2, the camera module 100 includes a circuit board 1, a photosensitive chip 2, a filter 3, a holder 4, and a lens assembly 5. The photosensitive chip 2 is mounted on the circuit board 3. The filter 3 is mounted in the holder 4. The holder 4 is mounted on the circuit board 1. The filter 3 is located at a side of the photosensitive chip 2 facing away from the circuit board 1, and is spaced from the photosensitive chip 2. The photosensitive chip 2 is received in the holder 4. The lens assembly 5 is mounted on the holder 4.

In at least one embodiment, the circuit board 1 may be a flexible circuit board, a rigid circuit board, or a flexible-rigid circuit board. Specifically, the circuit board 1 is a flexible-rigid circuit board, and includes a first rigid portion 10, a second rigid portion 12, and a flexible portion 14 connected to the first rigid portion 10 and the second rigid portion 12.

Figure 4:
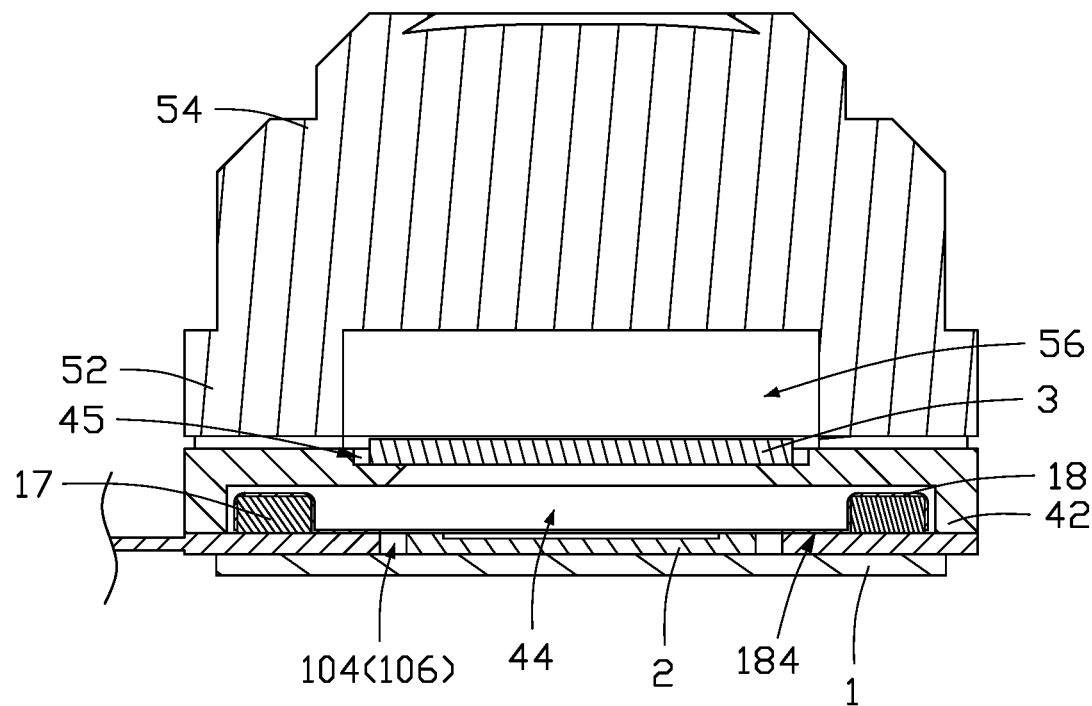
FIG. 4 is a cross-sectional view of the camera module taken along IV-IV line of FIG. 1.

Referring to FIG. 4, the first rigid portion 10 may be in a shape of a rectangular frame. The first rigid portion 10 includes a first surface 102 and a second surface 103 facing away from the first surface 102. A first receiving groove 104 penetrates the first surface 102 and the second surface 103. The photosensitive chip 2 is fixed in the first receiving groove 104. A size of the photosensitive chip 2 is less than a size of the first receiving groove 104 to separate the photosensitive chip 2 from an inner sidewall defining the first receiving groove 104, thereby forming a gap 106 (not labeled) between the photosensitive chip 2 and the inner sidewall defining the first receiving groove 104. A plurality of electronic elements 16 are mounted on the first surface 102. The plurality of electronic elements 16 forms two rows of electronic units 17 arranged opposite sides of the first receiving groove 104.

Figure 3:
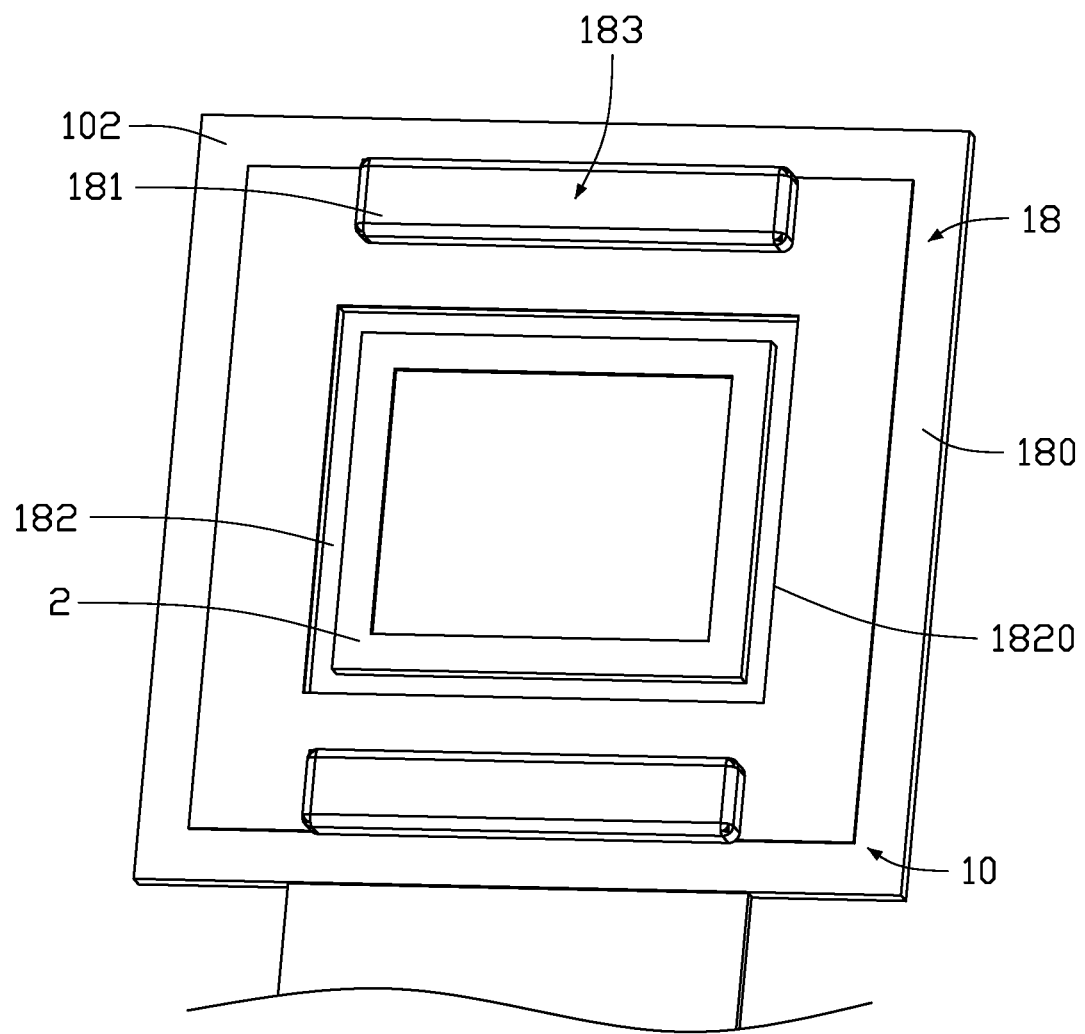
FIG. 3 is a partially diagram of an embodiment of a circuit board with a dustproof layer according to the present disclosure.

Referring to FIGS. 2, 3 and 4, a dustproof layer 18 is laid on the first surface 102 of the first rigid portion 10 and covers the electronic units 17. The dustproof layer 18 includes a first side 180 facing away from the first rigid portion 10 and a second side 184 facing the first rigid portion 10. A first through hole 182 penetrates the first side 180 and the second side 184. Two second receiving grooves 181 corresponding the electronic units 17 are recessed from the second side 184 in a direction away from the first rigid portion 10, thereby forming two protruding portions 183 on the first side 180. Each of the electronic units 17 is embedded into one of the second receiving grooves 181. The first through hole 182 corresponds to the first receiving groove 104, and an inner sidewall defining the first through hole 182 is flush with the inner sidewall defining the first receiving groove 104. In at least one embodiment, the photosensitive chip 2 may pass through the first through hole 182 and protrude from the first side 180 of the first through hole 182. In at least one embodiment, the dustproof layer 18 may be further laid in the gap 106 between the photosensitive chip 2 and the inner sidewall defining the first receiving groove 104.

The dustproof layer 18 may be a dustproof glue layer which may be formed by sprayed or formed by customized into an integral film. The integral film may be attached to the first rigid portion 10 by double-sided adhesive tape. The dustproof layer 18 can absorb the pollutants, dust, impurities, and solder resist falling inside the camera module 100 when the camera module 100 is shaken or dropped, thereby preventing contamination of the photosensitive chip 2 and improving an imaging quality of the camera module.

The dustproof layer 18 may be a water-based protective film to absorb dust, impurities, and fibers which are suspended, thereby purifying the air.

Figure 5:
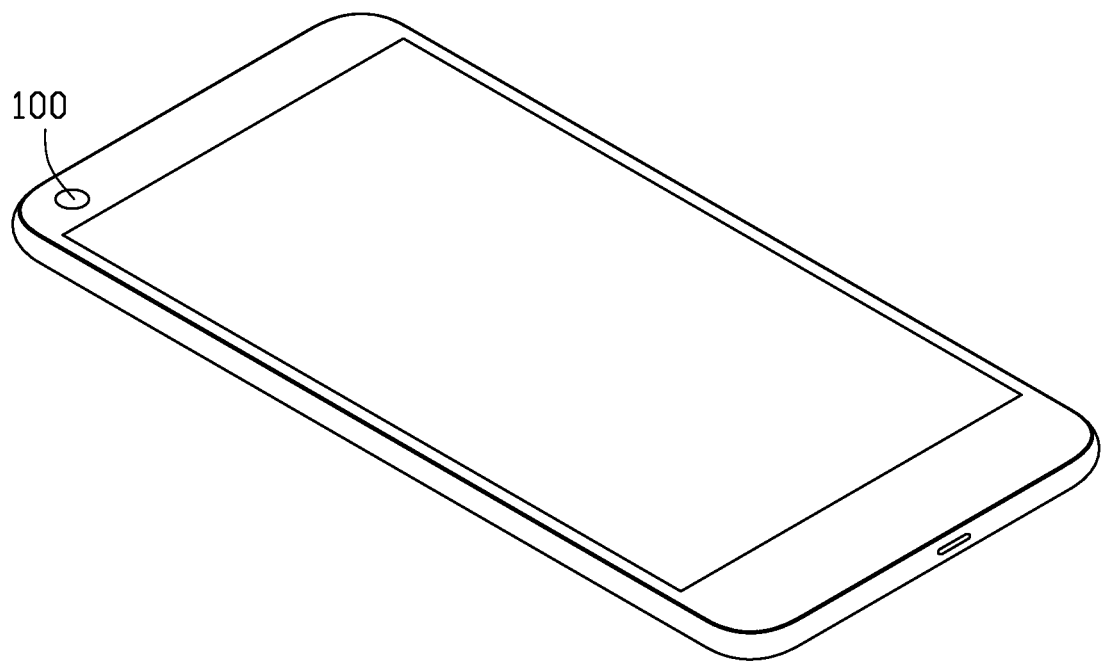
FIG. 5 is a diagram of an embodiment of an electronic device according to the present disclosure.

Referring to FIG. 5, an electrical connecting portion (not shown) is mounted on the second rigid portion 12. When the camera module 100 is applied in an electronic device 200, the electrical connecting portion is used to implement signal transmission between the camera module 100 and other components of the electronic device 200. The electrical connecting portion may be a connector or a golden finger. In at least one embodiment, the photosensitive chip 2, the plurality of electronic components 16, and the electrical connecting portion may be located on a same surface of the circuit board 1.

In at least one embodiment, the photosensitive chip 2 may have a rectangular shape. Each electronic component 16 may be a passive component such as a resistor, a capacitor, a diode, a triode, a relay, or an electrically erasable programmable read-only memory (EEPROM).

Referring to FIG. 2 and FIG. 4, the holder 4 has a frame shape, and is mounted on the circuit board 1. The holder 4 includes a first top wall 40 and a first side wall 42 vertically extending from a periphery of the first top wall 40. The first side wall 42 and the first top wall 40 surround to form a first receiving space 44. An end of the first side wall 41 facing away from the first top wall 40 is mounted on the first rigid portion 10 of the circuit board 1 by an adhesive layer (not shown). The plurality of electronic components 16, the photosensitive chip 2, and the filter 3 are received in the first receiving space 44. A third receiving groove 45 is recessed from the first top wall 40 toward the first rigid portion 10. A second though hole 46 corresponding to the photosensitive chip 2 penetrates a bottom surface of the third receiving groove 45. The filter 3 is mounted on the bottom surface of the third receiving groove 45 and covers the second though hole 46.

The holder 4 may be made of metal or plastic. Preferably, the holder 4 is made of aluminum alloy.

The lens assembly 5 is fixed on the holder 4 by an adhesive layer 50. The lens assembly 5 includes a lens base 52 and a lens 54 mounted on the lens base 52. A second receiving space 56 corresponding to the filter 3 penetrates the lens base 52. The lens 54 corresponds to the second receiving space 56. When light enter in the camera module 100 from the lens 54 and then passes through the filter 30 to the photosensitive chip 2.

The lens base 52 and the lens 54 may be assembled together or integrally formed. In at least one embodiment, the lens base 52 and the lens 54 are integrally formed. The lens 54 includes a first lens portion 540 and a second lens portion 542. The first lens portion 540 and the second lens portion 542 may be integrally formed. A diameter of the second lens portion 542 is less than a diameter of the first lens portion 540. A protective film 58 is installed on a top of the second lens portion 542 facing away from the first lens portion 540 to protect the lens 54.

FIG. 5 illustrates an embodiment of an electronic device 200 including the above camera module 100. The electronic device 200 may be, but not limited to, a mobile phone, a wearable device, a computer device, a vehicle or a monitoring device.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A camera module comprising:
   a circuit board;
   a photosensitive chip;
   a filter;
   a holder; and
   a lens assembly;
   wherein a receiving groove is recessed from a surface of the circuit board, the photosensitive chip is received in the receiving groove, the holder is mounted on the surface of the circuit board and covers the photosensitive chip, the filter is mounted in the holder and spaced from the photosensitive chip, the lens assembly is mounted on the holder and located at a side of the filter facing away from the photosensitive chip; a dustproof layer is laid on the surface of the circuit board facing the filter and surrounds the photosensitive chip; a size of the photosensitive chip is less than a size of the receiving groove to separate the photosensitive chip from an inner sidewall defining the receiving groove, a gap is formed between the photosensitive chip and the inner sidewall defining the receiving groove, and the dustproof layer is further laid in the gap.

2. The camera module of claim 1, wherein the dustproof layer covers a plurality of electronic elements mounted on the circuit board.

3. The camera module of claim 1, wherein the dustproof layer is a water-based protective film.

4. An electronic device comprising:
   a camera module comprising:
      a circuit board;
      a photosensitive chip;
      a filter;
      a holder; and
      a lens assembly;
   wherein a receiving groove is recessed from a surface of the circuit board, the photosensitive chip is received in the receiving groove, the holder is mounted on the surface of the circuit board and covers the photosensitive chip, the filter is mounted in the holder and spaced from the photosensitive chip, the lens assembly is mounted on the holder and located at a side of the filter facing away from the photosensitive chip; a dustproof layer is laid on the surface of the circuit board facing the filter and surrounds the photosensitive chip; a size of the photosensitive chip is less than a size of the receiving groove to separate the photosensitive chip from an inner sidewall defining the receiving groove, a gap is formed between the photosensitive chip and the inner sidewall defining the receiving groove, and the dustproof layer is further laid in the gap.

5. The electronic device of claim 4, wherein the dustproof layer covers a plurality of electronic elements mounted on the circuit board.

6. The electronic device of claim 4, wherein the dustproof layer is a water-based protective film.

* * * * *